United States Patent
Lee et al.

(10) Patent No.: US 9,490,833 B2
(45) Date of Patent: Nov. 8, 2016

(54) IMAGE SENSOR AND METHOD OF CONTROLLING THE SAME

(71) Applicant: Samsung Electronics Co., Ltd., Suwon-si (KR)

(72) Inventors: Hyeokjong Lee, Yongin-si (KR); Jinho Seo, Seoul (KR); Seogheon Ham, Suwon-si (KR)

(73) Assignee: Samsung Electronics Co., Ltd. (KR)

(*) Notice: Subject to any disclaimer, the term of this patent is extended or adjusted under 35 U.S.C. 154(b) by 69 days.

(21) Appl. No.: 14/310,065

(22) Filed: Jun. 20, 2014

(65) Prior Publication Data

US 2015/0029372 A1 Jan. 29, 2015

(30) Foreign Application Priority Data

Jul. 25, 2013 (KR) ........................ 10-2013-0088113

(51) Int. Cl.
| | |
|---|---|
| *H04N 3/14* | (2006.01) |
| *H04N 5/335* | (2011.01) |
| *H03M 1/36* | (2006.01) |
| *H04N 5/347* | (2011.01) |
| *H04N 5/378* | (2011.01) |
| *H03M 1/06* | (2006.01) |
| *H03M 1/12* | (2006.01) |
| *H03M 1/56* | (2006.01) |

(52) U.S. Cl.
CPC ............. *H03M 1/36* (2013.01); *H03M 1/0624* (2013.01); *H04N 5/347* (2013.01); *H04N 5/378* (2013.01); *H03M 1/123* (2013.01); *H03M 1/56* (2013.01)

(58) Field of Classification Search
CPC .. H04N 5/374; H04N 5/3742; H04N 5/3745; H04N 3/1506; H04N 3/1575
USPC .......... 348/302–304, 308; 341/143, 155, 172
See application file for complete search history.

(56) References Cited

U.S. PATENT DOCUMENTS

| | | | |
|---|---|---|---|
| 7,683,818 B2 | 3/2010 | Muramatsu et al. | |
| 8,330,635 B2 | 12/2012 | Hisamatsu | |
| 8,390,486 B2 | 3/2013 | Wang et al. | |
| 8,395,539 B2 | 3/2013 | Lim et al. | |
| 8,432,471 B2 | 4/2013 | Lim et al. | |
| 8,451,342 B2 | 5/2013 | Lim et al. | |
| 8,749,682 B2* | 6/2014 | Moore | H04N 5/3658 341/155 |
| 2003/0214597 A1* | 11/2003 | Nam | H04N 5/3575 348/308 |

(Continued)

FOREIGN PATENT DOCUMENTS

| | | |
|---|---|---|
| JP | 2011259407 | 12/2011 |
| KR | 1020120077364 | 7/2012 |

*Primary Examiner* — Kelly L Jerabek

(74) *Attorney, Agent, or Firm* — Myers Bigel & Sibley, P.A.

(57) ABSTRACT

Provided is an image sensor including a sensor array including a plurality of pixels arranged in rows and columns. The image sensor may include a ramp signal generator which may generate a ramp signal. The intensity of the ramp signal may increase or decrease in response to a ramp enable signal. The image sensor may include an analog-digital converter electrically connected to one of the columns of the pixels. The analog-digital converter may be configured to compare an output signal from the one of the columns of the pixels with the ramp signal, thereby generating time information. The analog-digital converter may be configured to convert the time information to digital information in response to a counter enable signal. An activation of the counter enable signal may be delayed by a predetermined time delay, compared with that of the ramp enable signal.

18 Claims, 11 Drawing Sheets

(56) References Cited

U.S. PATENT DOCUMENTS

| | | |
|---|---|---|
| 2011/0074968 A1 | 3/2011 | Kim et al. |
| 2011/0279723 A1 | 11/2011 | Takamiya et al. |
| 2011/0292265 A1 | 12/2011 | Takahashi et al. |
| 2012/0033097 A1* | 2/2012 | Lim ..................... H04N 5/3765 348/222.1 |
| 2012/0039548 A1 | 2/2012 | Wang et al. |
| 2012/0133803 A1* | 5/2012 | Lee ........................ H04N 5/361 348/243 |
| 2012/0133808 A1* | 5/2012 | Park ......................... G01J 1/46 348/294 |
| 2012/0169905 A1* | 7/2012 | Ovsiannikov .......... H04N 5/208 348/252 |
| 2012/0305752 A1 | 12/2012 | Shimizu et al. |
| 2012/0320244 A1 | 12/2012 | Hagihara |
| 2013/0021493 A1* | 1/2013 | Ishibashi ................ H04N 5/335 348/222.1 |
| 2013/0135503 A1* | 5/2013 | Park .......................... H03F 1/34 348/308 |
| 2013/0201361 A1* | 8/2013 | Yang .................. H04N 5/23229 348/222.1 |

\* cited by examiner

IMAGE SENSOR AND METHOD OF CONTROLLING THE SAME

CROSS-REFERENCE TO RELATED APPLICATION

This application claims priority under 35 U.S.C. §119 to Korean Patent Application No. 10-2013-0088113 filed Jul. 25, 2013 in the Korean Intellectual Property Office, the entire contents of which are hereby incorporated herein by reference.

FIELD

Example embodiments of the inventive concept relate to image sensors, and in particular, to image sensors producing a counter enable signal corresponding to a delayed ramp signal and a method of controlling the same.

BACKGROUND

An image sensor is a device that converts optical images into electrical signals. With increased development of the computer and communications industries, there may be an increased demand for high performance image sensors that may be used for capturing images in a variety of applications such as digital cameras, camcorders, personal communication systems (PCS's), gaming machines, security cameras, micro-cameras for medical applications, and/or robots.

Image sensors may include complementary metal-oxide-semiconductor (CMOS) image sensors and charge coupled devices (CCDs). CMOS image sensors can be operated with a simple driving manner and may be integrated with signal processing circuits on a single chip, thus enabling products that include the CMOS image sensors to be scaled down. In addition, CMOS image sensors may operate with relatively low power consumption. Thus, CMOS image sensors are applicable to portable electronic devices. Furthermore, CMOS image sensors may be fabricated using CMOS fabrication techniques, which may reduce manufacturing costs. Moreover, CMOS image sensors may provide high resolution images. Accordingly, the use of CMOS image sensors is being increased.

The image sensors may include a plurality of pixel sensors arranged in rows and columns to form a rectangular shape. The pixel sensors in each column may be connected to a corresponding one of column data lines and may be selected row by row to operate the column data lines. Image signals from the column data lines may be converted into digital signals by ADC circuits connected to the column data lines. Various techniques may be used to generate the digital signals from the analogue image signals, including a dual correlated double sampling (dual CDS) using a single-slope analogue-digital converting technique.

The image sensors are being used for portable devices (e.g., cellular phone) or for taking moving pictures, and thus, high resolution, low power consumption, and high speed are needed in the image sensors. Accordingly, a variety of studies are being conducted to reduce a short operation delay that was a negligible issue in the past.

SUMMARY

According to some embodiments of the inventive concept, there is provided an image sensor. The image sensor may include a sensor array which may include a plurality of pixels arranged in rows and columns. The image sensor may include a ramp signal generator which may generate a ramp signal. The intensity of the ramp signal may increase or decrease in response to a ramp enable signal. The image sensor may include an analog-digital converter electrically connected to one of the columns of the pixels. The analog-digital converter may be configured to compare an output signal from the one of the columns of the pixels with the ramp signal, thereby generating time information. The analog-digital converter may be configured to convert the time information to digital information in response to a counter enable signal. An activation of the counter enable signal may be delayed by a predetermined time delay, compared with that of the ramp enable signal.

The image sensor may include a row driver electrically connected to one of the rows of the pixels. The row driver may be configured to sequentially operate the pixels by a unit of row, in response to a row driver control signal.

The image sensor may include a timing signal generator configured to generate the ramp enable signal, the counter enable signal, and the row driver control signal.

The analog-digital converter may include a comparator configured to compare the output signal from the one of the columns of the pixels with the ramp signal and thereby generating the time information.

The analog-digital converter may include a counter configured to convert the time information to the digital information in response to the counter enable signal.

The predetermined time delay may be set corresponding to a delayed time of the ramp signal.

The predetermined time delay may be set proportional to a parasitic capacitance of the analog-digital converter.

The sensor array may be operated using a pixel binning, in which at least one of the pixels may be selectively operated. The predetermined time delay may be set proportional to a sum of parasitic capacitances of the analog-digital converter corresponding to the selectively operated pixels.

According to some embodiments of the inventive concept, there is provided a method of controlling an image sensor. The image sensor may include a sensor array including a plurality of pixels arranged in rows and columns, a ramp signal generator generating a ramp signal, a comparator connected to one of the columns of the pixels, a counter connected to the comparator, and a row driver connected to one of the rows of the pixels. A time delay may be set based on a delayed time of the ramp signal. A row driver control signal and a ramp enable signal may be generated. A counter enable signal may be generated whose activation time may be delayed by the time delay, compared with that of the ramp enable signal.

The time delay may be set proportional to a parasitic capacitance of the comparator.

The sensor array may be operated using a pixel binning, in which at least one of the pixels may be selectively operated. The time delay may be set proportional to a sum of parasitic capacitances of the comparator corresponding to the selectively operated pixels.

The generating of the row driver control signal and the ramp enable signal may be executed to generate the ramp signal. The intensity of the ramp signal may increase or decrease with a specific rate, in response to the ramp enable signal from the ramp signal generator.

In generating the row driver control signal and the ramp enable signal, the row driver may operate the pixels by a unit of row, in response to the row driver control signal.

According to some embodiments of the inventive concept, there is provided an analog-digital converter circuit. The analog-digital converter circuit may include a ramp signal generator. The ramp signal generator may generate a ramp signal in response to an activation of a ramp enable signal. The analog-digital converter circuit may include a comparator module. The comparator module may be configured to compare one of a plurality of input signals with the ramp signal to produce a time information signal. The analog-digital converter circuit may include a counter module. The counter module may be configured to convert the time information signal to a digital information signal in response to a counter enable signal. An activation of the counter enable signal may be delayed from the activation of the ramp enable signal by a predetermined time delay.

The analog-digital converter circuit may include a timing signal generator. The timing signal generator may be configured to generate the ramp enable signal and the counter enable signal.

The predetermined time delay may be set corresponding to a delayed time of the ramp signal.

The predetermined time delay may be set proportional to a parasitic capacitance at an input to the comparator module.

The comparator module may include a plurality of comparators. Each of the comparators may be configured to compare a respective one of the plurality of input signals with the ramp signal to produce the time information signal for the respective input signal.

The counter module may include a plurality of counters. Each of the counters may be configured to convert a respective time information signal to a digital information signal in response to the counter enable signal.

Less than all of the comparators may be selectively operated. The predetermined time delay may be set proportional to a sum of parasitic capacitances of the selectively operated comparators.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

DETAILED DESCRIPTION OF THE EMBODIMENTS

Figure 1:
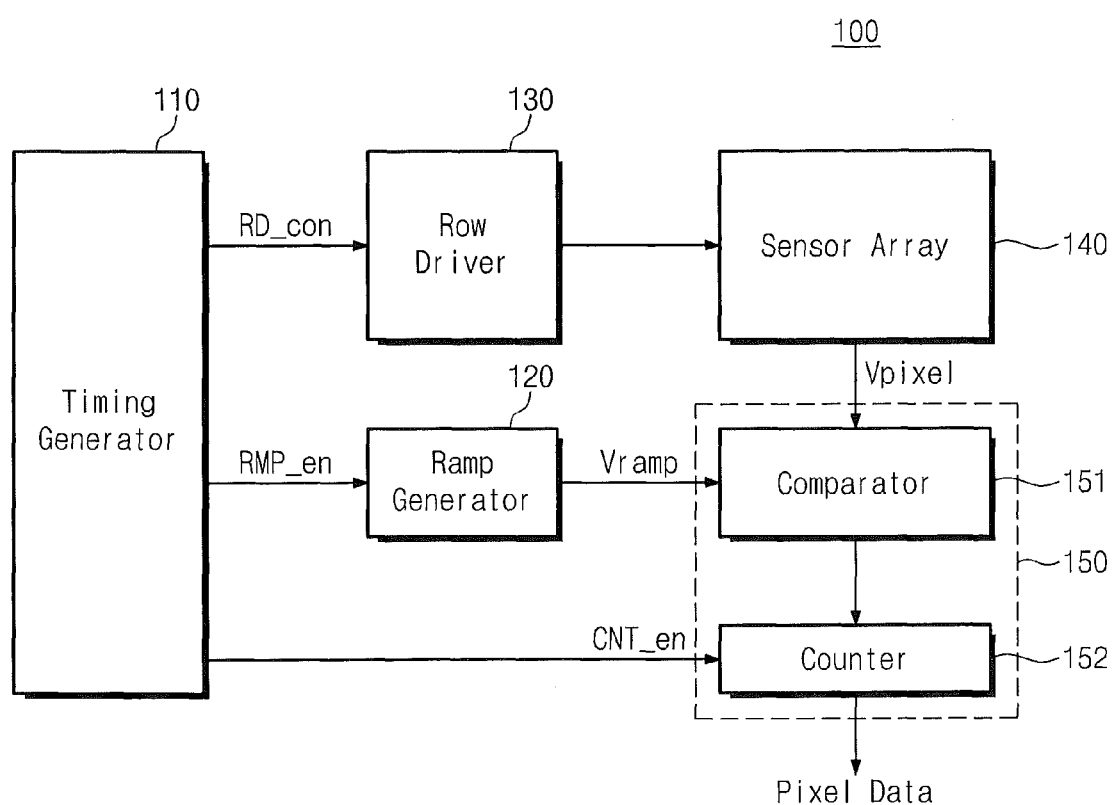
FIG. 1 is a schematic block diagram illustrating an image sensor according to example embodiments of the inventive concept.

Embodiments are described in detail with reference to the accompanying drawings. The inventive concept, however, may be embodied in various different forms, and should not be construed as being limited only to the illustrated embodiments set forth herein. Rather, these embodiments are provided as examples so that this disclosure will be thorough and complete, and will fully convey the concept of the inventive concept to those skilled in the art. Unless otherwise noted, like reference numerals denote like elements throughout the attached drawings and written description, and thus descriptions may not be repeated.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Hereinafter, an image sensor is used as an example of an electronic device to describe the features and functions of the inventive concept. However, those skilled in the art will understand other advantages and performances based on the content listed herein. Moreover, the present inventive concept may be implemented or applied through other embodiments. Furthermore, the detailed description may be modified or changed without departing from the scope, technical ideas, and other purposes of the inventive concept.

FIG. 1 is a schematic block diagram illustrating an image sensor according to example embodiments of the inventive concept. Referring to FIG. 1, an image sensor 100 may include a timing signal generator 110, a ramp signal generator 120, a row driver 130, a sensor array 140, and an analog-digital converter 150. The analog-digital converter 150 may include a comparator 151 and a counter 152.

The timing signal generator 110 may generate timing signals in response to control signals. For example, the timing signal generator 110 may generate a row driver control signal RD_con for controlling an operation of the row driver 130. The timing signal generator 110 may generate a ramp enable signal RMP_en for controlling an operation of the ramp signal generator 120. The timing signal generator 110 may generate a counter enable signal CNT_en for controlling an operation of a counter 152. The timing signal generator 110 may be configured in such a way that the counter enable signal CNT_en is delayed from the ramp enable signal RMP_en by a predetermined value.

The ramp signal generator 120 may generate a ramp signal Vramp in response to the ramp enable signal RMP_en. The ramp signal Vramp may be a signal, whose amplitude is time-dependent. The ramp signal Vramp may be transmitted to the comparator 151 and be used to convert an analog signal to a digital signal therein.

The row driver 130 may operate sequentially a plurality of rows in the sensor array 140 in response to the row driver control signal RD_con. The row driver 130 may be electrically connected to the plurality of the rows in the sensor array 140. In pixels constituting a selected row, detected lights may be converted into electric signals (hereinafter, referred to as "at least one pixel signal Vpixel").

The sensor array 140 may include a plurality of light-detection devices. The sensor array 140 may include a plurality of rows and a plurality of columns. Each of the light-detection devices may be provided at a corresponding one of intersections of the rows and the columns. The light-detection device may be a photo diode, a photo transistor, a photo gate, a pinned photo diode (PPD), or any combination thereof. For example, the light-detection device may be provided to include a photo diode, a transfer transistor, a reset transistor, an amplifying transistor, and a selection transistor, and thereby have a 4-transistor structure. Alternatively, the light-detection device may have one of a 1-transistor structure, a 3-transistor structure, or a 5-transistor structure, or a transistor-sharing structure, in which at least one transistor is shared by a plurality of pixels. In the sensor array 140, light may be transformed into at least one pixel signal Vpixel, which will be transferred to the analog-digital converter 150.

In the analog-digital converter 150, the at least one pixel signal Vpixel transmitted from the sensor array 140 may be converted from an analog signal into a digital signal (hereinafter, referred to as a "pixel data").

The comparator 151 may receive the ramp signal Vramp and the at least one pixel signal Vpixel. In the comparator 151, the ramp signal Vramp and the at least one pixel signal Vpixel may be compared with each other, and time information may be transmitted to the counter 152. In the comparator 151, a correlated double sampling (CDS) operation may be performed to reduce noise. For example, the image sensor 100 may further include a CDS circuit for removing noise from signals based on a difference between a reference signal and the at least one pixel signal Vpixel.

The counter 152 may generate a counting signal corresponding to the ramp signal Vramp, in response to the counter enable signal CNT_en. For example, when the ramp signal Vramp is started, a counting operation may be started in the counter 152. In example embodiments, the timing signal generator 110 may be configured to generate the counter enable signal CNT_en with starting time, which is different from the ramp enable signal RMP_en, in consideration of a delay of the ramp signal Vramp. In the counter 152, the time information transmitted from the comparator 151 may be converted into digital information and output as pixel data.

Figure 2:
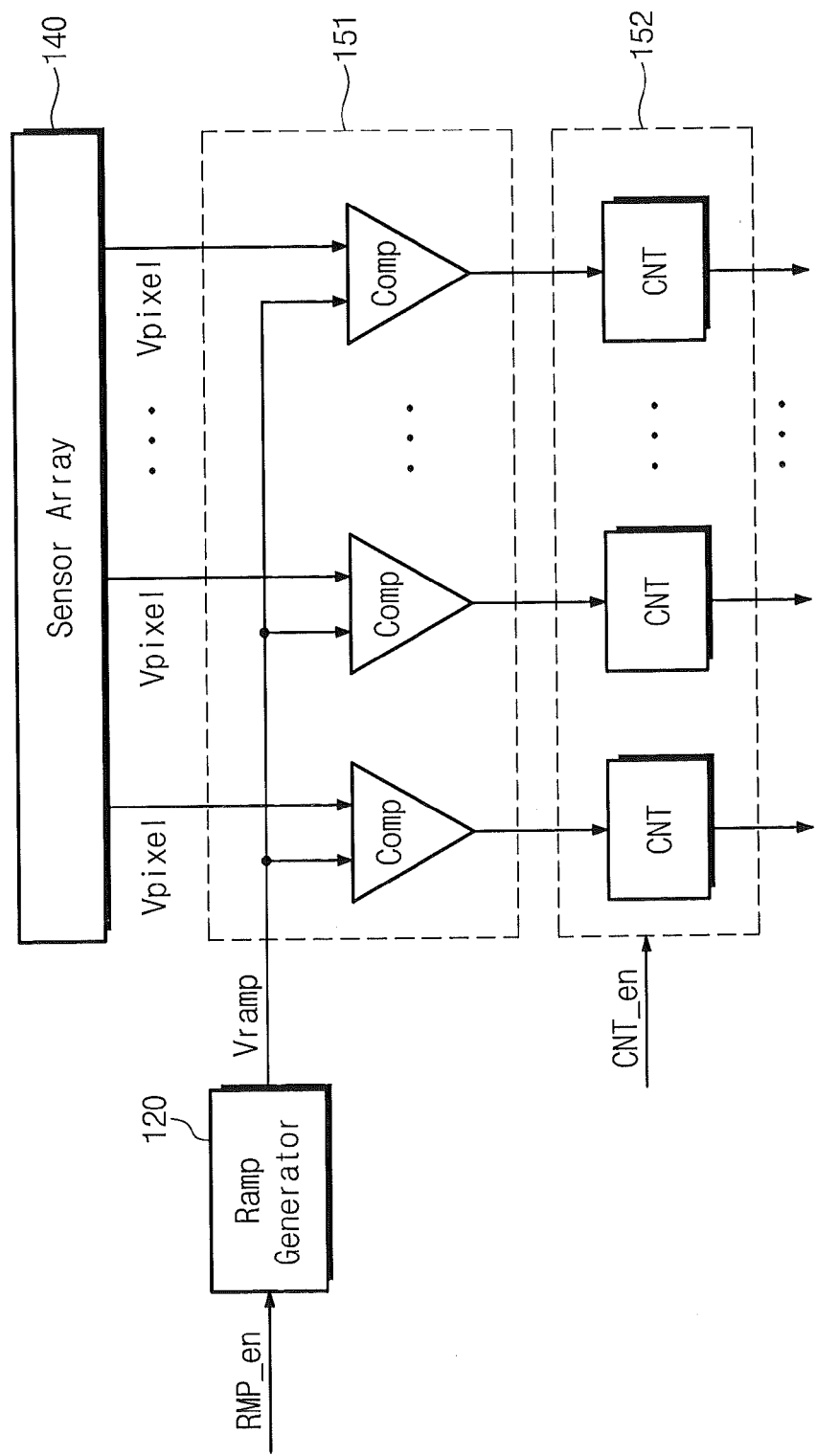
FIG. 2 is a schematic block diagram illustrating a comparator and a counter of FIG. 1.

FIG. 2 is a diagram illustrating a comparator and a counter of FIG. 1. Referring to FIG. 2, the sensor array 140 may include a plurality of columns. The comparator 151 may include a plurality of comparators Comp coupled to the columns of the sensor array 140. The counter 152 may include a plurality of counters CNT coupled to the comparators Comp. Each column of the sensor array 140 may be connected in series to a corresponding one of the comparators Comp and a corresponding one of the counters CNT. The ramp signal Vramp, which may be generated by the ramp signal generator 120 in response to the ramp enable signal RMP_en, may be equally provided to each of the comparators Comp.

Each pixel of the sensor array 140 may convert light into an electric signal and output the electric signal as a pixel signal Vpixel. Each comparator Comp may compare the ramp signal Vramp with the pixel signal Vpixel and output the result as time information. Each counter CNT may convert the time information into digital information, in response to the counter enable signal CNT_en. Here, a parasitic capacitor may be formed in an input terminal of each comparator Comp. The parasitic capacitor may result in a delay of the ramp signal Vramp. Each comparator Comp may be configured to compare a pixel signal Vpixel with the delayed ramp signal Vramp. Accordingly, due to the presence of the parasitic capacitor, each counter CNT may perform the counting operation based on the delayed ramp signal Vramp. This will be described with reference to FIG. 4. As the device becomes faster and faster, the delayed ramp signal Vramp may have an increasing effect on an image processing speed.

Figure 3:
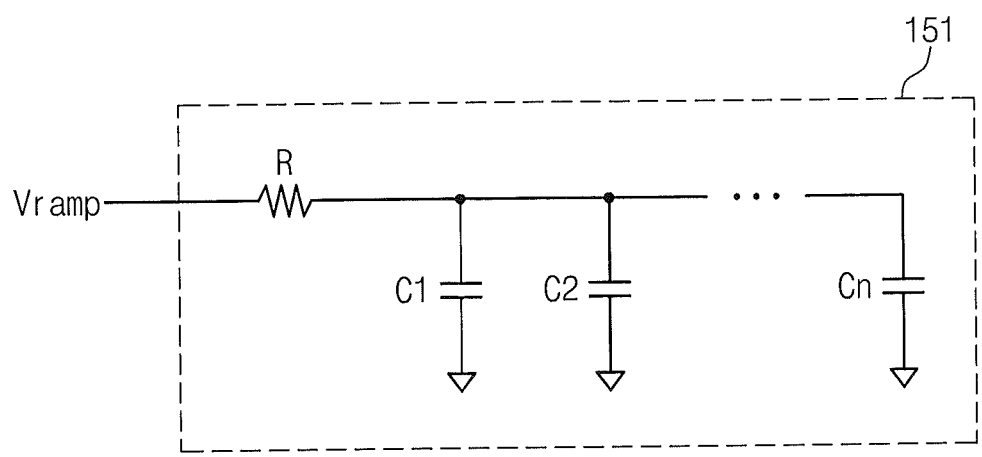
FIG. 3 is an equivalent circuit diagram illustrating a parasitic capacitor of an input terminal in the comparator of FIG. 2.

FIG. 3 is an equivalent circuit diagram illustrating a parasitic capacitor of an input terminal in the comparator of FIG. 2. Referring to FIGS. 2 and 3, in the comparators Comp, parasitic capacitors C1-Cn of the input terminal may be connected in parallel to each other. The ramp signal Vramp may be affected by the capacitors C1-Cn that are connected in parallel to each other. If the parasitic capacitors C1-Cn are connected in parallel to each other, a total capacitance of the parasitic capacitors C1-Cn is equal to a sum of capacitances of the parasitic capacitors C1-Cn. If the number of the columns in the sensor array 140 increases, the number of the parasitic capacitors C1-Cn connected in parallel to each other increases, and thus, the ramp signal Vramp may be affected by an increased capacitance. In other words, a larger number of columns may result in a larger delay of the ramp signal Vramp.

Figure 4:
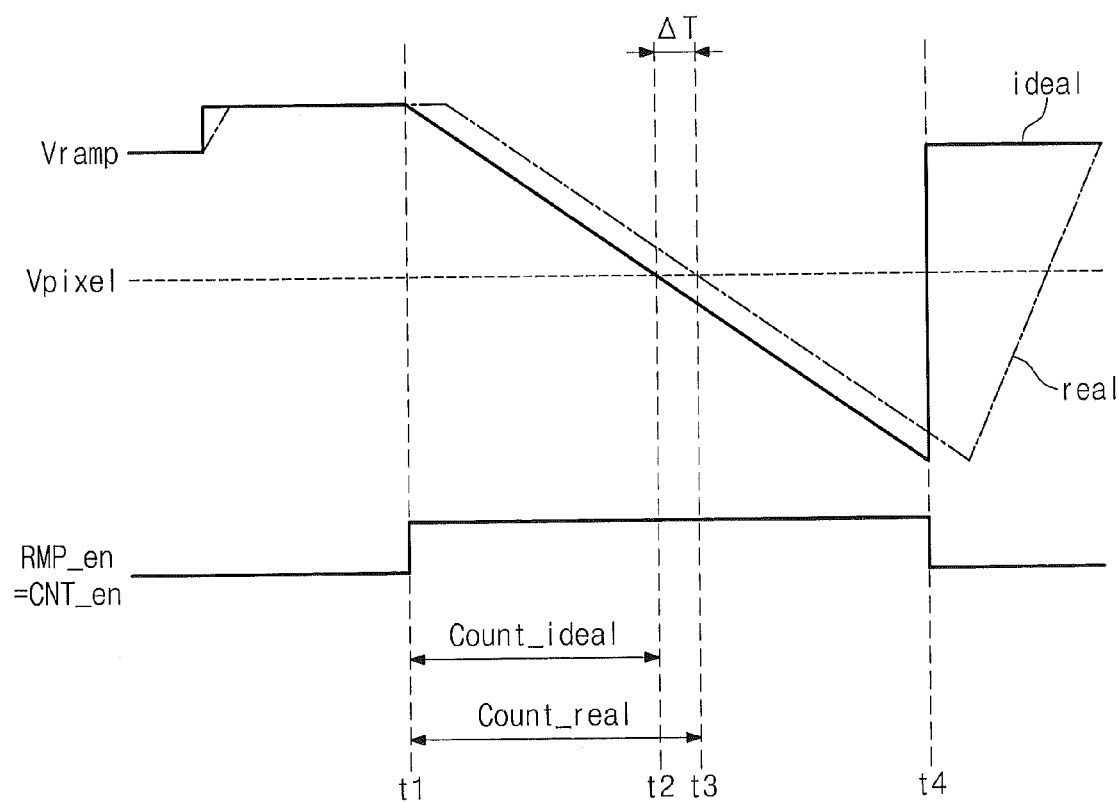
FIG. 4 is a timing diagram illustrating a conventional analog-digital converting operation.

FIG. 4 is a timing diagram illustrating a conventional analog-digital converting operation. The analog-digital converting operation on one column of the sensor array 140 will be described with reference to FIGS. 2 through 4. In FIG. 4, the solid line represents an ideal ramp signal Vramp. For example, a signal output from the ramp signal generator 120 may be the same as the ideal ramp signal Vramp. The ideal ramp signal Vramp may descend from time t1 to time t4. However, in a real case, the ramp signal Vramp may be delayed due to the presence of the parasitic capacitors, as shown in an alternated long and short dash line.

Generally, the ramp and counter enable signals RMP_en and CNT_en may be generated to have a high level at the same time (e.g., t1). The pixel signal Vpixel depicted by a dotted line may be an electric signal converted from light incident into the corresponding pixel of the sensor array 140. The comparator Comp may compare the ramp signal Vramp with the pixel signal Vpixel and transmit time information to the counter CNT. The counter CNT may count the time information transmitted from the comparator Comp and convert it to digital information. In an ideal case, the counting Count_ideal of the counter CNT may be performed from the time t1 to the time 2, when an ideal ramp signal Vramp is equal to the pixel signal Vpixel. However, in the real case, the counting Count_real of the counter CNT may be performed from time t1 to time 3, when the delayed ramp signal Vramp is equal to the pixel signal Vpixel. In the real case, the counting operation of the counter CNT may be performed for a longer time by time interval $\Delta T$, and this may result in an increase in power consumption. Furthermore, time taken to obtain data from each pixel may be increased by the time interval $\Delta T$, compared with the ideal case.

Figure 5:
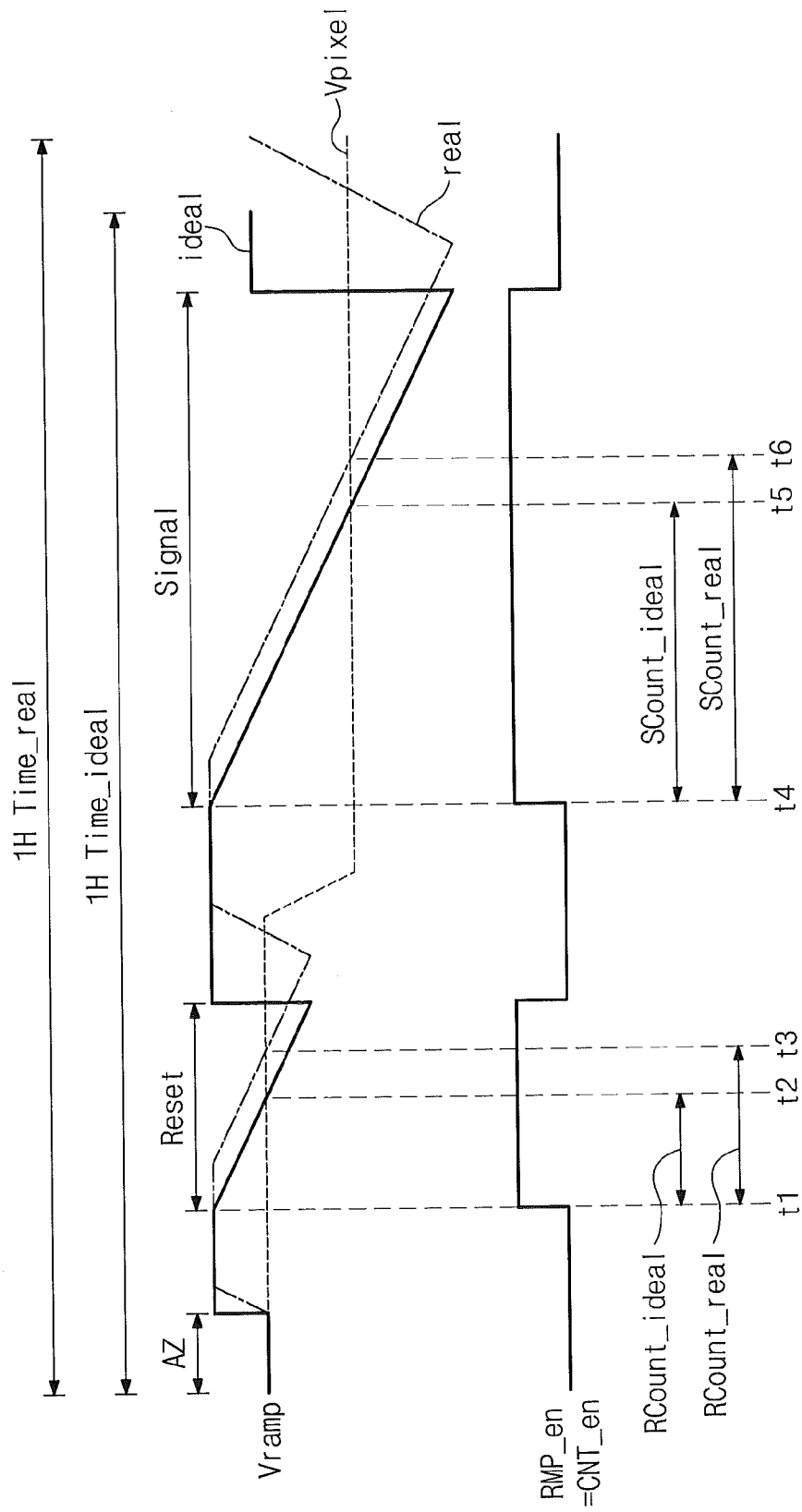
FIG. 5 is a timing diagram illustrating an expanded analog-digital converting operation of FIG. 4.

FIG. 5 is a timing diagram illustrating an expanded analog-digital converting operation of FIG. 4. The expanded analog-digital converting operation on one column of the sensor array 140 will be described with reference to FIGS. 1 through 5. Hereinafter, time taken to obtain pixel data from each row will be referred to as "1H Time". Since data can be simultaneously obtained from all pixels in each row, the 1H Time may be substantially equal to time taken to obtain data from each pixel. During the 1H Time, in the image sensor 100, an operation of obtaining the pixel data may include an auto-zero period AZ, a reset period Reset, and a signal period Signal. During the auto-zero period AZ, in the image sensor 100, a level of the ramp signal Vramp may be adjusted to be equal to that of the pixel signal Vpixel. During the reset period Reset, to provide a reference for obtaining exactly the pixel data, the image sensor 100 may measure a pixel voltage based on remaining charges in each pixel. The pixel voltage measured during the reset period Reset may vary depending on a position of the pixel. During the signal period Signal, the image sensor 100 may convert light into electric signal, which will serve as the pixel data.

As previously described with reference to FIG. 4, during the signal period Signal, the real counting operation SCount_real in the counter CNT may be longer than the ideal counting operation SCount_ideal. Similarly, during the reset period Reset, the real counting operaion RCount_real may also be longer than the ideal counting operation RCount_ideal. Accordingly, the power may be more consumed by the extra counting operation, compared with the ideal case. Further, due to the delay of the ramp signal Vramp, a real 1H time (1H Time_real) may be longer than an ideal 1H time (1H Time_ideal).

Figure 6:
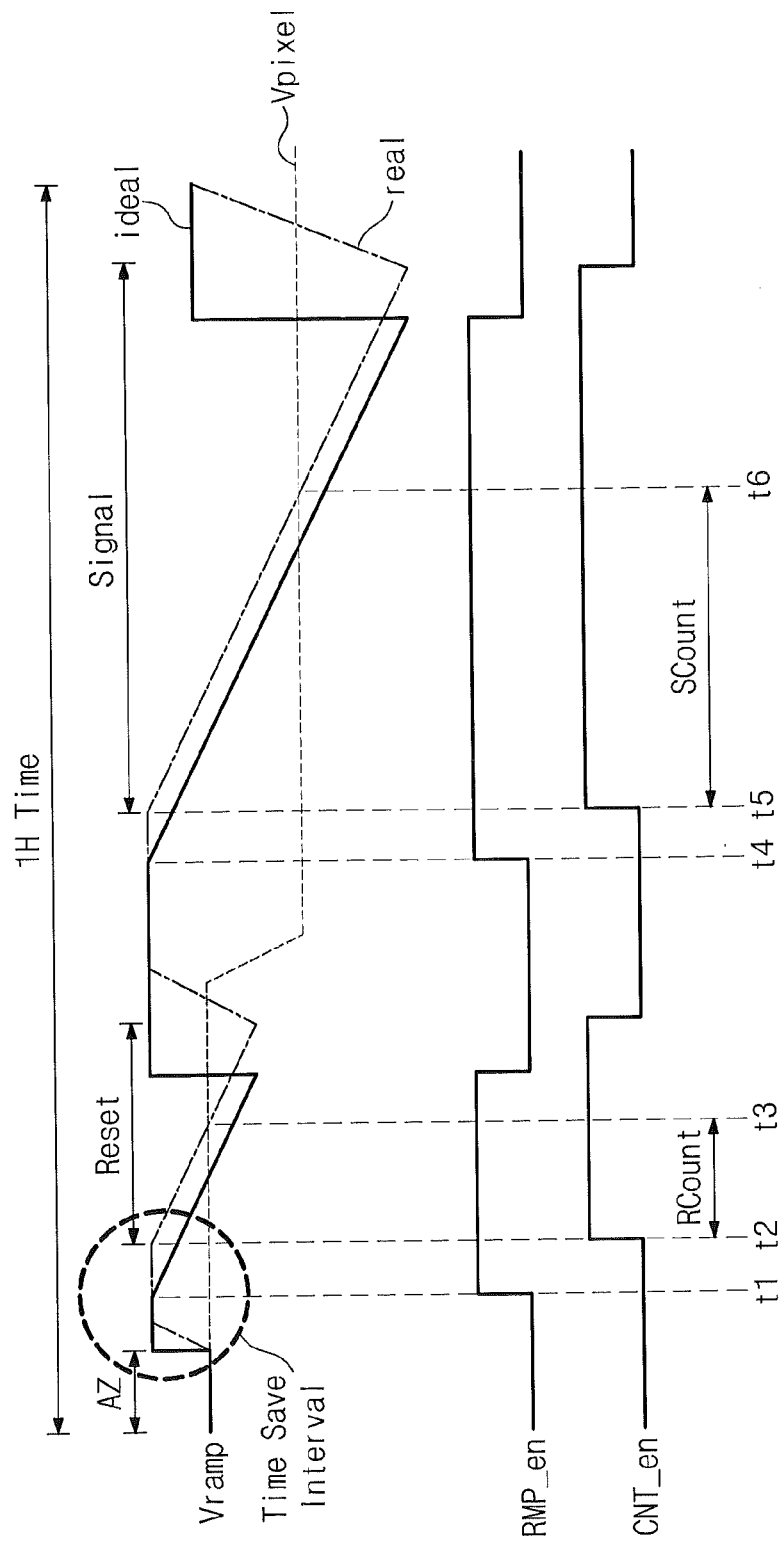
FIG. 6 is a timing diagram illustrating a method of controlling an image sensor, according to example embodiments of the inventive concept.

FIG. 6 is a timing diagram illustrating a method of controlling an image sensor, according to example embodiments of the inventive concept. The controlling method on one column of the sensor array 140 will be described with reference to FIGS. 1 through 6. The image sensor 100 may set the auto-zero period AZ, the reset period Reset, and the signal period Signal on the basis of the delayed ramp signal Vramp. Accordingly, the timing signal generator 110 may generate in such a way that the counter enable signal CNT_en is different from the ramp enable signal RMP_en. For example, the ramp signal generator 120 may generate in such a way that the ramp signal Vramp starts to descend at time t1 or time t4, in response to the ramp enable signal RMP_en. The counter CNT may start the counting operation at time t2 or time t5, in response to the counter enable signal CNT_en. In the counter CNT, the counting operation may not be performed in a period from t1 to t2 or from t4 to t5. Such reduction of the counting operation may reduce power consumption of the image sensor.

Further, in consideration of the delay of the ramp signal Vramp, the image sensor 100 may start the reset period Reset at time t2. An interval (Time Save Interval) between the reset period Reset and the auto-zero period AZ may be preserved to be constant, which may reduce the 1H Time as compared with the 1H Time_real described with reference to FIG. 5. In other words, it may be possible to reduce time taken to obtain pixel data from each row of the sensor array 140. Furthermore, it may be possible to reduce time taken to obtain pixel data from all rows of the sensor array 140. Accordingly, the image sensor can have an improved image processing speed.

Figure 7:
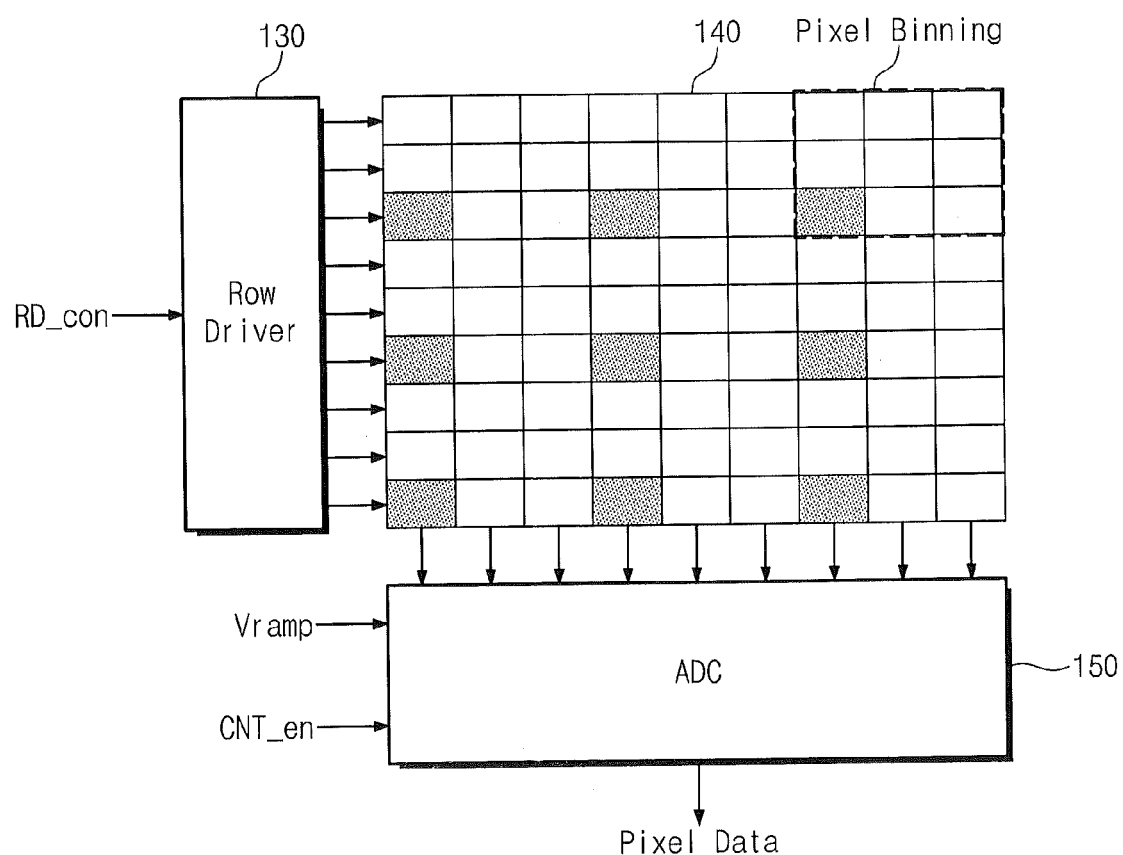
FIG. 7 is a block diagram schematically illustrating a method of controlling a sensor array, according to example embodiments of the inventive concept.

FIG. 7 is a block diagram schematically illustrating a method of controlling a sensor array, according to example embodiments of the inventive concept. Referring to FIG. 7, the sensor array 140 may include a plurality of pixel binning groups, each of which includes at least two pixels. A pixel binning may refer to a way of combining at least two pixels. FIG. 7 show an example of the pixel binning, in which 3×3 or nine pixels are combined, when the sensor array 140 may include 9×9 pixels. The pixel binning may be utilized to take a moving picture or a still picture of low resolution.

In FIG. 7, pixels with a gray pattern are operated and pixels without any pattern are not operated when a corresponding row is selected by the row driver 130. For example, in the case where the last row of the sensor array 140 is selected, only three pixels of the nine pixels constituting the last row may be operated. Accordingly, it may be possible to reduce the parasitic capacitance, which may affect the ramp signal Vramp during the operation of the analog-digital converter 150. Further, it is possible to reduce a width of the delay of the ramp signal Vramp. According to example embodiments of the inventive concept, the timing signal generator 110 of FIG. 1 may control the timing of increasing or lowering the counter enable signal CNT_en to a high or low level, based on the reduction in the parasitic capacitance.

Figure 8:
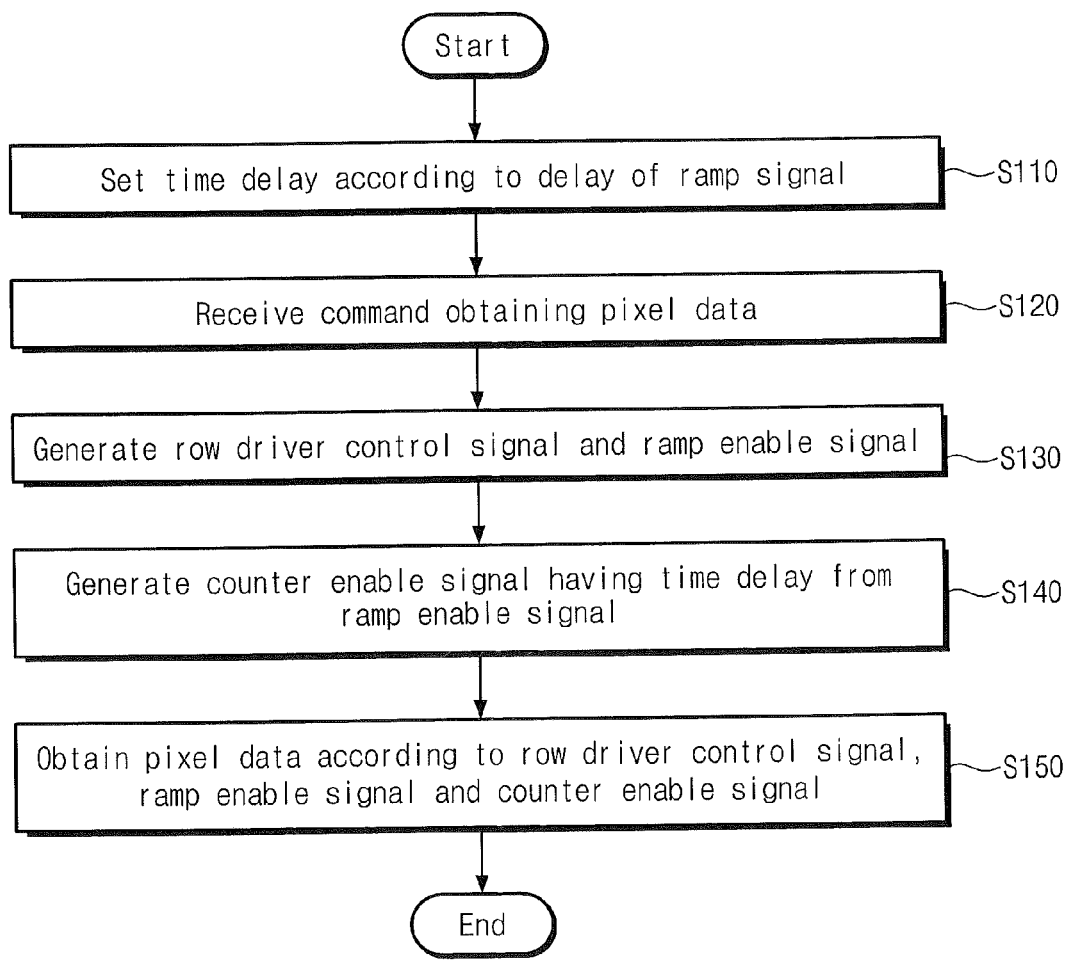
FIG. 8 is flow chart schematically illustrating a method of controlling an image sensor, according to example embodiments of the inventive concept.

FIG. 8 is flow chart schematically illustrating a method of controlling an image sensor, according to example embodiments of the inventive concept. Referring to FIG. 8, the image sensor 100 of FIG. 1 may be configured to generate the ramp and counter enable signals RMP_en and CNT_en, which may have different start times from each other, thereby having an increased image processing speed.

In a step S110, the timing signal generator 110 may set a time delay according to a delayed time of the ramp signal Vramp. If the number of the columns in the sensor array 140 is fixed, it may be possible to determine the parasitic capacitance of the comparator 151 and thereby calculate a delayed time of the ramp signal Vramp. The time delay may be set based on the delayed time of the ramp signal Vramp to be obtained by the calculation. If a pixel binning is used, one of several values for the time delay may be set according to a change in the parasitic capacitance.

In a step S120, the image sensor 100 may receive a command for obtaining pixel data, from a main system. The pixel data may be a still or moving picture. The image sensor 100 may start preparing for operating the sensor array 140, according to a type of the pixel data.

In a step S130, the timing signal generator 110 may generate the row driver control signal RD_con and the ramp enable signal RMP_en. The row driver 130 may operate sequentially the rows of the sensor array 140 in response to the row driver control signal RD_con. The ramp signal generator 120 may generate the ramp signal Vramp in response to the ramp enable signal RMP_en.

In a step S140, the timing signal generator 110 may generate the counter enable signal CNT_en. Based on the set time delay, the counter enable signal CNT_en may be generated to have a different start time from that of the ramp enable signal RMP_en. For example, the counter enable signal CNT_en may be generated in consideration of the delay of the ramp signal Vramp. The counter 152 may perform the counting operation based on the counter enable signal CNT_en.

In a step S150, the image sensor 100 may obtain the pixel data in response to the row driver control signal RD_con, the ramp enable signal RMP_en, and the counter enable signal CNT_en. The row driver 130 may operate or select sequentially the rows of the sensor array 140, in response to the row driver control signal RD_con. In the pixels of the selected row, the pixel signal Vpixel may be generated from light incident therein and be transmitted to the comparator 151. In the ramp signal generator 120, the ramp signal Vramp may be generated in response to the ramp enable signal RMP_en, according to an operation timing for each row of the sensor array 140. The ramp signal Vramp may be transmitted to the comparator 151. In the comparator 151, the ramp signal Vramp and the pixel signal Vpixel may be compared with each other to generate the time information, which will be transmitted to the counter 152. In the counter 152, the counting operation may be performed to correspond to the delay of the ramp signal Vramp, in response to the counter enable signal CNT_en. In the counter 152, the time information may be converted into digital information or the pixel data, which will be output. According to example embodiments of the inventive concept, the counting operation in the image sensor 100 may be performed in consideration of the delay of the ramp signal Vramp, and thus, it may be possible to realize the image sensor 100 with lowered power consumption and an improved image processing speed.

Figure 9:
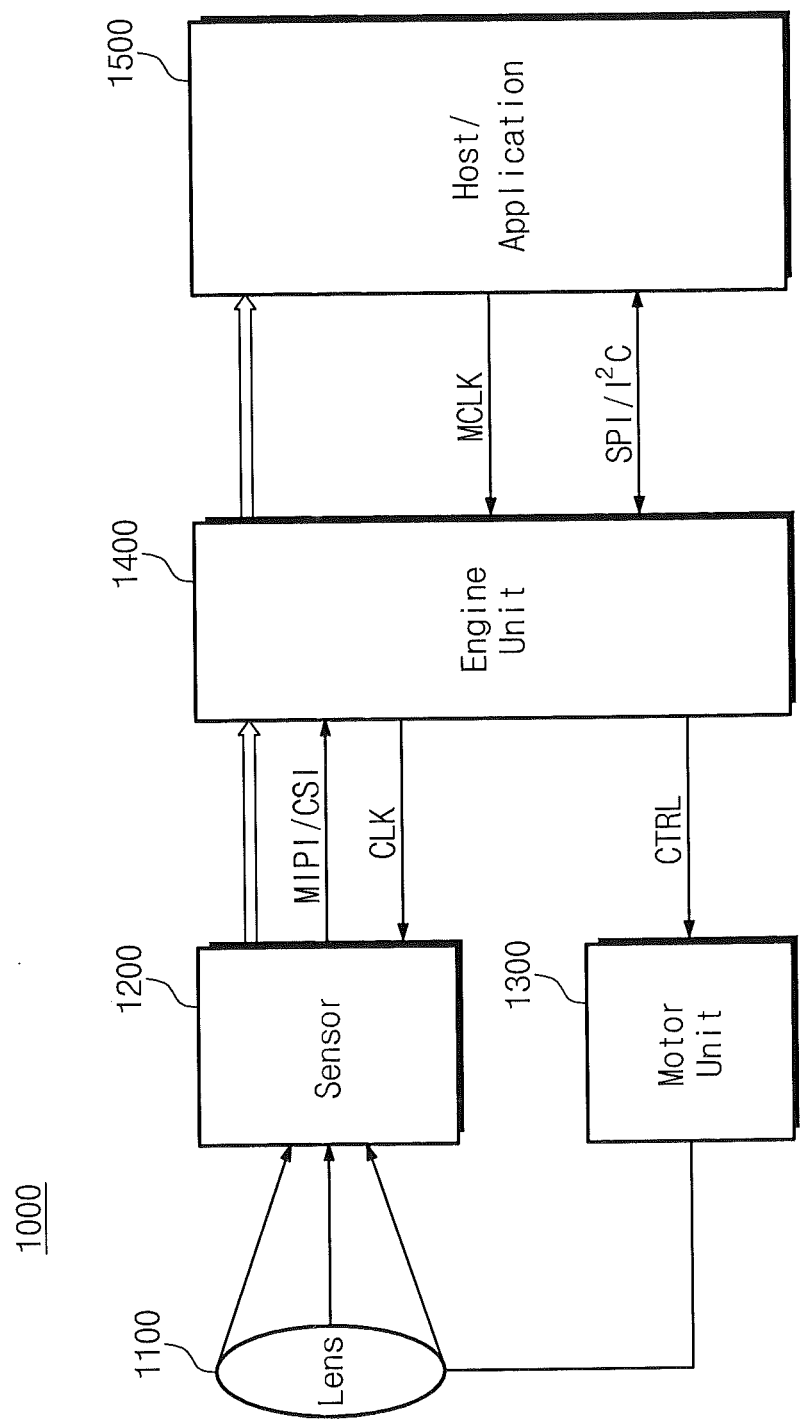
FIG. 9 is a block diagram illustrating a camera system including an image sensor, according to other example embodiments of the inventive concept.

FIG. 9 is a block diagram illustrating a camera system including an image sensor, according to other example embodiments of the inventive concept. The camera system may include, for example, a digital camera. Referring to FIG. 9, the camera system 1000 may include a lens 1100, an image sensor 1200, a motor unit 1300, and an engine unit 1400. The image sensor 1200 may include one of the image sensors, which are configured to be able to reduce the image processing time of the camera system, according to example embodiments of the inventive concept.

The lens 1100 focuses incident light onto a light receiving region of the image sensor 1200. The image sensor 1200 may generate RGB data in a Bayer pattern based on the light received through the lens 1100. The image sensor 1200 may provide the RGB data in response to a clock signal CLK. For example, the image sensor 1200 may interface with the engine unit 1400 using a mobile industry processor interface (MIPI®) and/or a camera serial interface (CSI). The motor unit 1300 may adjust the focus of the lens 1100 in response to a control signal CTRL received from the engine unit 1400 or perform shuttering. The engine unit 1400 controls the image sensor 1200 and the motor unit 1300. The engine unit 1400 may generate YUV data including a luminance component, a difference between the luminance component and a blue component, and a difference between the luminance component and a red component based on the RGB data received from the image sensor 1200 or generate compressed data, e.g., Joint Photography Experts Group (JPEG) data.

The engine unit 1400 may be connected to a host/application 1500 and may provide the YUV data or JPEG data to the host/application 1500 based on a master clock signal MCLK. In addition, the engine unit 1400 may interface with the host/application 1500 using a serial peripheral interface (SPI) and/or an inter integrated circuit ($I^2C$).

Figure 10:
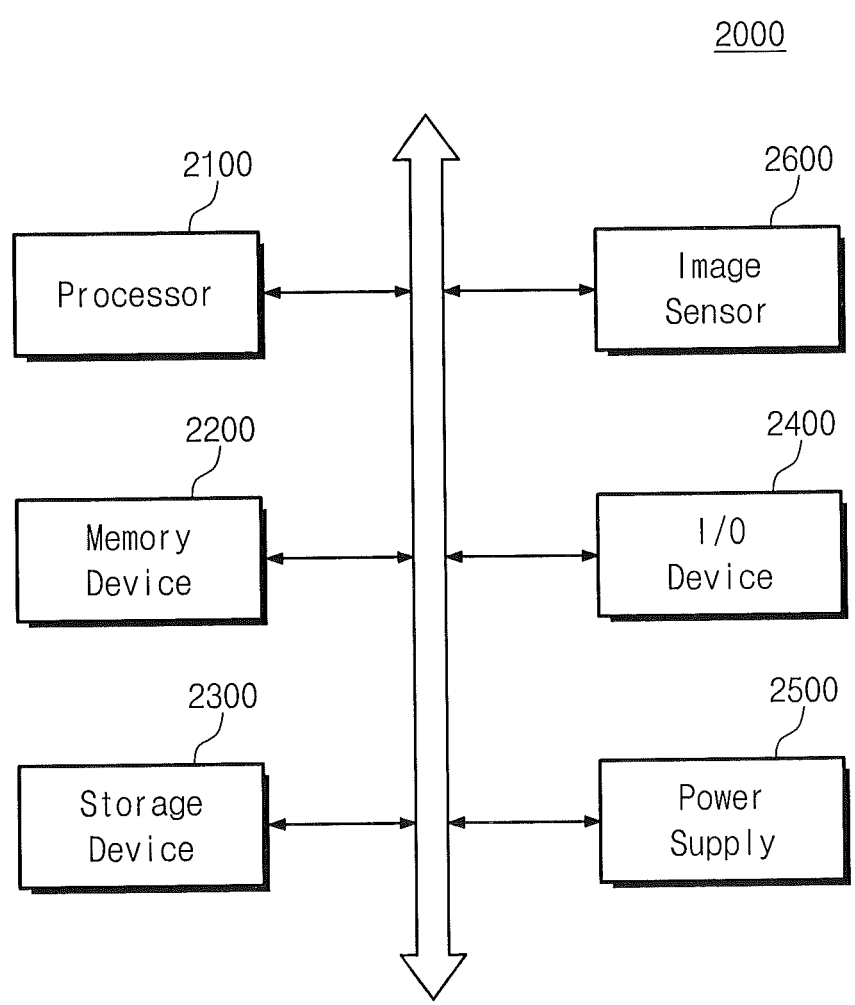
FIG. 10 is a block diagram illustrating a computer system including an image sensor, according to still other example embodiments of the inventive concept.

FIG. 10 is a block diagram illustrating an example of computing systems including an image sensor, according to still other example embodiments of the inventive concept. Referring to FIG. 10, a computing system 2000 may include a processor 2100, a memory device 2200, a storage device 2300, an input/output (I/O) device 2400, a power supply 2500, and an image sensor 2600.

The image sensor 2600 may include one of the image sensors, which are configured to be able to reduce the image processing time, according to example embodiments of the inventive concept. The computing system 2000 may also include ports that can communicate with video cards, sound cards, memory cards, universal serial bus (USB) devices, or other electronic devices.

The processor 2100 may perform particular calculations or tasks. In some embodiments, the processor 2100 may be a microprocessor or a central processing unit (CPU). The processor 2100 may communicate with the memory device 2200, the storage device 2300, and the I/O device 2400 through an address bus, a control bus, and a data bus.

In some embodiments, the processor 2100 may also be connected to an extended bus such as a peripheral component interconnect (PCI) bus. The memory device 2200 may store data necessary for the operations of the computing system 2000.

The memory device 2200 may be implemented by dynamic random access memory (DRAM), mobile DRAM, static RAM (SRAM), or a non-volatile memory device.

The non-volatile memory device may be implemented by, for example, electrically erasable programmable read-only memory (EEPROM), FLASH memory, conductive bridging RAM (CBRAM), ferroelectric RAM (FeRAM), ovonic unified memory (OUM) or phase change RAM (PRAM), resistive RAM (RRAM or ReRAM), nanotube RRAM (Nanotube RRAM), polymer RAM (PoRAM), nano floating gate memory (NFGM), holographic memory, molecular electronics memory device, or insulator resistance change memory.

The memory device and/or the image sensor may be packaged in various kinds of ways. For instance, the semiconductor memory device and/or memory system may be employed in a Package on Package (PoP), Ball Grid Array (BGA), Chip Scale Package (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP).

The storage device 2300 may include a solid state drive (SSD), a hard disk drive (HDD), and a compact disk-read only memory (CD-ROM).

The I/O device 2400 may include an input device such as a keyboard, a keypad, and a mouse and an output device such as a printer and a display. The power supply 2500 may provide an operating voltage necessary for the operation of the computing system 2000.

The image sensor 2600 may communicate with the processor 2100 through buses or other communication links. According to example embodiments of the inventive concept, as described above, the image sensor 2600 may be configured to be able to reduce the image processing time. The image sensor 2600 and the processor 2100 may be integrated together into a single chip or may be separately integrated into different chips, respectively.

The computing system 2000 may be any type of computing system using an image sensor. For instance, the computing system 2000 may be a digital camera, a cellular phone, a personal digital assistant (PDA), a portable multimedia player (PMP), a smart phone, or a tablet personal computer (PD).

Figure 11:
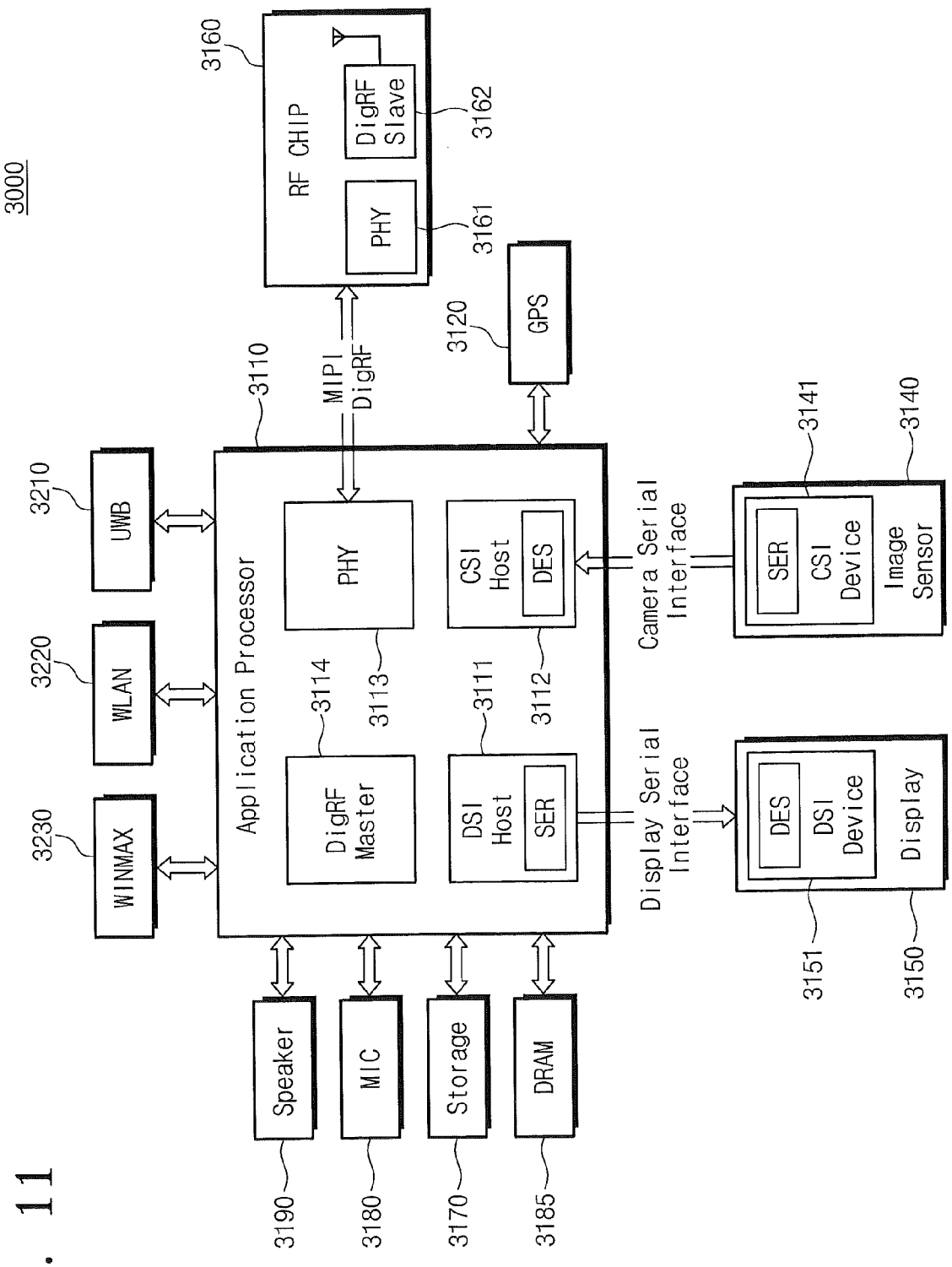
FIG. 11 is a block diagram illustrating an electronic system including an image sensor, according to yet other example embodiments of the inventive concept, and an interface.

FIG. 11 is a block diagram illustrating an electronic system including an image sensor, according to yet other example embodiments of the inventive concept, and an interface. Referring to FIG. 11, an electronic system 3000 may be implemented as a data processing device (e.g., portable cellular telephone, PDA, PMP, or smartphone), which can use or support a MIPI® interface. The electronic system 3000 may include an application processor 3110, an image sensor 3140, and a display 3150. The image sensor 3140 may include one of the image sensors, which are configured to be able to reduce the image processing time, according to example embodiments of the inventive concept.

A CSI host 3112 included in the application processor 3110 may perform serial communication with a CSI device 3141 included in the image sensor 3140 through CSI. For example, the CSI host 3112 may include a deserializer DES and CSI device 3141 may include a serializer SER.

A display serial interface (DSI) host 3111 included in the application processor 3110 may perform serial communication with a DSI device 3151 included in the display 3150 through DSI. The DSI host 3111 may include a serializer SER and DSI device 3151 may include a deserializer DES.

The electronic system 3000 may also include a radio frequency (RF) chip 3160 which can communicate with the application processor 3110. A physical layer (PHY) 3113 of the application processor 3110 and a PHY 3161 of the RF chip 3160 may communicate data with each other according to MIPI DigRF.

The application processor 3110 may also include a DigRF master 3114 which controls the PHY 3113 and/or the PHY 3161 to transmit and receive data according to the MIPI DigRF. The electronic system 3000 may further include a global positioning system (GPS) 3120, a storage 3170, a microphone (MIC) 3180, a DRAM 3185, and a speaker 3190.

Further, the electronic system 3000 may communicate using an ultra-wideband (UWB) interface 3210, a wireless local area network (WLAN) 3220, and a worldwide interoperability for microwave access (WIMAX) interface 3230. The structure and the interface of the electronic system 3000 illustrated in FIG. 11 are provided as an example, and example embodiments of the inventive concept are not restricted thereto.

According to example embodiments of the inventive concept, the counter enable signal may be set depending on a delayed ramp signal. This may enable improving characteristics of the image sensor (e.g., reduced power consumption and increased image processing speed).

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive.

What is claimed is:

1. An image sensor, comprising:
a sensor array including a plurality of pixels arranged in rows and columns;
a ramp signal generator generating a ramp signal, whose intensity increases or decreases in response to a ramp enable signal; and
an analog-digital converter electrically connected to one of the columns of the pixels, wherein the analog-digital converter is configured to compare an output signal from the one of the columns of the pixels with the ramp signal, thereby generating time information, and to convert the time information to digital information, in response to a counter enable signal,
wherein an activation of the counter enable signal is delayed by a predetermined time delay, compared with that of the ramp enable signal,
wherein the predetermined time delay is set corresponding to a delayed time of the ramp signal.

2. The image sensor of claim 1, further comprising a row driver electrically connected to one of the rows of the pixels, wherein the row driver is configured to sequentially operate the pixels by a unit of row, in response to a row driver control signal.

3. The image sensor of claim 2, further comprising a timing signal generator configured to generate the ramp enable signal, the counter enable signal, and the row driver control signal.

4. The image sensor of claim 1, wherein the analog-digital converter comprises a comparator configured to compare the output signal from the one of the columns of the pixels with the ramp signal and thereby generating the time information.

5. The image sensor of claim 4, wherein the analog-digital converter comprises a counter configured to convert the time information to the digital information in response to the counter enable signal.

6. The image sensor of claim 1, wherein the predetermined time delay is set proportional to a parasitic capacitance of the analog-digital converter.

7. The image sensor of claim 1, wherein the sensor array is operated using a pixel binning, in which at least one of the pixels is selectively operated, and
the predetermined time delay is set proportional to a sum of parasitic capacitances of the analog-digital converter corresponding to the selectively operated pixels.

8. A method of controlling an image sensor comprising a sensor array including a plurality of pixels arranged in rows and columns, a ramp signal generator generating a ramp signal, a comparator connected to one of the columns of the pixels, a counter connected to the comparator, and a row driver connected to one of the rows of the pixels, comprising:
setting a time delay based on a delayed time of the ramp signal;
generating a row driver control signal and a ramp enable signal;

generating a counter enable signal, whose activation time is delayed by the time delay, compared with that of the ramp enable signal.

9. The method of claim 8, wherein the time delay is set proportional to a parasitic capacitance of the comparator.

10. The method of claim 8, wherein the sensor array is operated using a pixel binning, in which at least one of the pixels is selectively operated, and
the time delay is set proportional to a sum of parasitic capacitances of the comparator corresponding to the selectively operated pixels.

11. The method of claim 8, wherein, the generating of the row driver control signal and the ramp enable signal is executed to generate the ramp signal, whose intensity increases or decreases with a specific rate, in response to the ramp enable signal from the ramp signal generator.

12. The method of claim 8, wherein, in the generating of the row driver control signal and the ramp enable signal, the row driver operates the pixels by a unit of row, in response to the row driver control signal.

13. An image sensor, comprising:
a ramp signal generator generating a ramp signal in response to an activation of a ramp enable signal;
a comparator module configured to compare one of a plurality of input signals with the ramp signal to produce a time information signal; and
a counter module configured to convert the time information signal to a digital information signal in response to a counter enable signal,
wherein an activation of the counter enable signal is delayed from the activation of the ramp enable signal by a predetermined time delay,
wherein the predetermined time delay is set corresponding to a delayed time of the ramp signal.

14. Tire image sensor of claim 13, further comprising a timing signal generator configured to generate the ramp enable signal and the counter enable signal.

15. The image sensor of claim 13, wherein the predetermined time delay is set proportional to a parasitic capacitance at an input to the comparator module.

16. The image sensor of claim 13, wherein the comparator module comprises a plurality of comparators, wherein each of the comparators is configured to compare a respective one of the plurality of input signals with the ramp signal to produce the time information signal for the respective input signal.

17. The image sensor of claim 16, wherein the counter module comprises a plurality of counters, wherein each of the counters is configured to convert a respective time information signal to a digital information signal in response to the counter enable signal.

18. The image sensor of claim 16, wherein less than all of the comparators are selectively operated, and
the predetermined time delay is set proportional to a sum of parasitic capacitances of the selectively operated comparators.

* * * * *